United States Patent [19]

Waterman et al.

[11] Patent Number: 5,225,314
[45] Date of Patent: Jul. 6, 1993

[54] IMAGING PROCESS, AND IMAGING MEDIUM FOR USE THEREIN

[75] Inventors: Kenneth C. Waterman, Arlington; Michael A. Young, Natick; Edward P. Lindholm, Brookline, all of Mass.

[73] Assignee: Polaroid Corporation, Cambridge, Mass.

[21] Appl. No.: 686,501

[22] Filed: Apr. 17, 1991

[51] Int. Cl.$^5$ .......................... G03F 7/004; G03F 7/34
[52] U.S. Cl. .................................. 430/253; 430/200;
    430/254; 430/256; 430/257; 430/259; 430/260;
    430/273; 430/292; 430/293; 430/330; 430/350;
    430/358; 430/944; 430/964
[58] Field of Search ............... 430/253, 254, 200, 291,
    430/292, 273, 293, 257, 258, 259, 260, 263, 270,
    271, 358, 964, 330, 256, 353, 350, 944

[56] References Cited

U.S. PATENT DOCUMENTS

| | | | |
|---|---|---|---|
| 3,487,764 | 1/1970 | Borden et al. | 96/28 |
| 3,890,152 | 6/1975 | Ruckert et al. | 96/75 |
| 3,915,704 | 10/1975 | Limburg et al. | 96/27 R |
| 3,915,706 | 10/1975 | Limburg et al. | 96/27 R |
| 3,917,483 | 11/1975 | Limburg et al. | 96/27 R |
| 3,923,514 | 12/1975 | Marsh | 96/35 |
| 3,964,907 | 6/1976 | Marsh | 96/35 |
| 4,081,282 | 3/1978 | Merrill et al. | 96/77 |
| 4,123,309 | 10/1978 | Perrington et al. | 156/234 |
| 4,123,578 | 10/1978 | Perrington et al. | 428/206 |
| 4,145,216 | 3/1979 | Merrill et al. | 96/28 |
| 4,157,412 | 6/1979 | Deneau | 428/147 |
| 4,210,711 | 7/1980 | Kitajima et al. | 430/253 |
| 4,284,703 | 8/1981 | Inoue et al. | 430/253 |
| 4,356,252 | 10/1982 | Lee | 430/270 |
| 4,508,811 | 4/1985 | Gravesteijn et al. | 430/270 |
| 4,806,451 | 2/1989 | Froehlich | 430/291 |
| 4,910,120 | 3/1990 | Platzer et al. | 430/253 |
| 4,916,046 | 4/1990 | Doessel | 430/281 |

FOREIGN PATENT DOCUMENTS

| | | | |
|---|---|---|---|
| 292323 | 11/1988 | European Pat. Off. | |
| 62-247348 | 10/1987 | Japan | 430/259 |
| 62-247349 | 10/1987 | Japan | 430/259 |
| WO88/04237 | 6/1988 | PCT Int'l Appl. | |

OTHER PUBLICATIONS

Frechet, J. M. J. et al., J. Imaging Sci, 30(2), 59 (1986).
Crivello et al., J. Polym. Sci., Polym. Chem. Ed., 17, 977, 1047 and 2877 (1979).
Crivello et al., J. Polym. Sci., Polym. Chem. Ed., 18, 1021 (1980).
Crivello et al., Macromol., 10, 1307 (1977).
Devoe et al., Can. J. Chem., 66, 319 (1988).
Fotland, J. Phot. Sci., 18, 33 (1970).
Sprague et al., Phot. Sci. Eng., 5, 98 (1961).
Sprague et al., Phot. Sci. Eng., 8, 95 (1964).
Sprague et al., Phot. Sci. Eng., 9, 133 (1965).
Kubisa, Polymer, 21, 1433 (1980).
Woodruff et al., Image Formation by Photoadhesion, Photog. Sci. Eng., 11(3), 93 (1967).
Berkower et al., Photopolymer Image Transfer Rheology, Photog. Sci. Eng., 12(6), 283 (1968).
Nakayama et al., Photodelamination Imaging—A New Approach in Dry Processing, J. Soc. Photog. Sci. Eng., 22(3), 138 (1978).
Busman et al., Peel-Apart Imaging Systems Based on Photoactivated Surfactants, J. Imaging. Tech., 11(4), 191 (1985).
Sabongi, G. J. Chemical Triggering-Reactions of Potential Utility in Industrial Processes; Plenum Press, New York, N.Y. (1987) pp. 49-51, 68-72, 97-101 and 162-164.

Primary Examiner—Marion E. McCamish
Assistant Examiner—Janis L. Dote
Attorney, Agent, or Firm—David J. Cole

[57] ABSTRACT

An imaging medium comprises a layer, depolymerizable by exposure to actinic radiation and undergoing a reduction in cohesivity upon at least partial depolymerization, disposed adjacent a layer of an imaging material, which has a cohesive strength greater than the cohesive strength of the depolymerizable layer after depolymerization. This medium is imagewise exposed to radiation, thereby causing at least partial depolymerization of the polymer in the exposed areas, so rendering these exposed areas lower in cohesivity than the unexposed areas. The exposed areas of the imaging material are then removed from the depolymerizable layer.

25 Claims, 8 Drawing Sheets

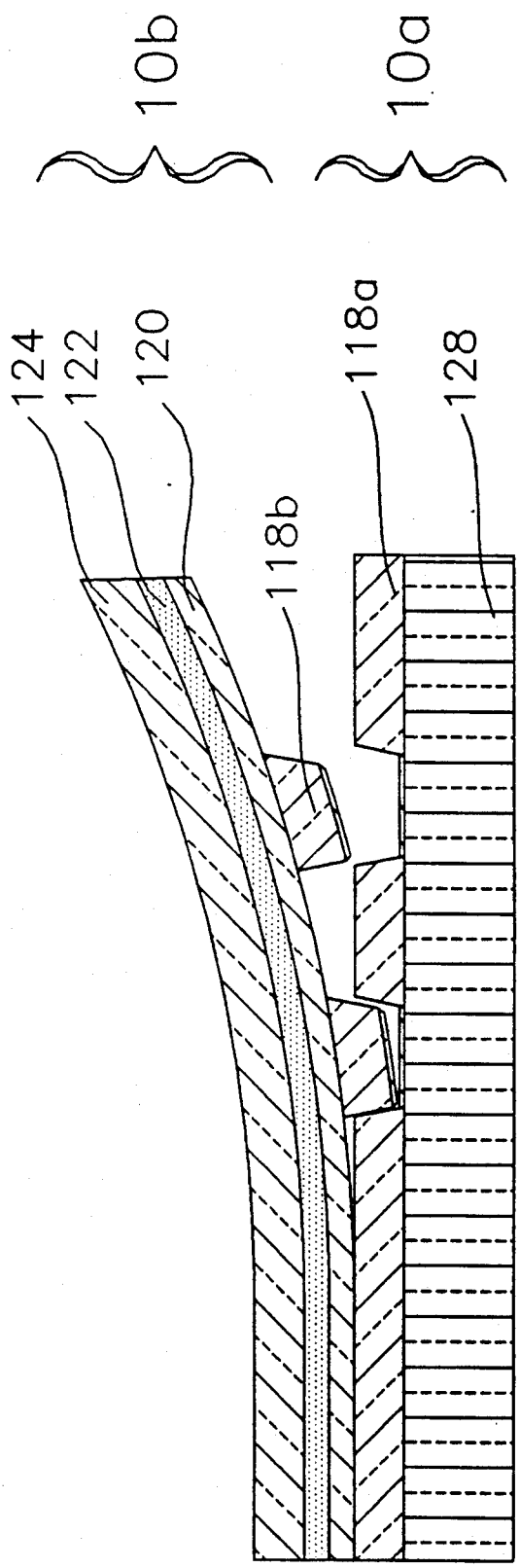

IMAGING PROCESS, AND IMAGING MEDIUM FOR USE THEREIN

REFERENCE TO RELATED APPLICATION

Attention is directed to the commonly assigned and copending application, of even date herewith, of Kenneth C. Waterman, entitled "Imaging process, and imaging medium for use thereon" (Applicants' reference C-7641), which discloses and claims an imaging process and medium somewhat similar to the process and medium of the present invention, but in which a depolymerizable layer is depolymerized by radiation such that the exposed areas become tacky, thereby firmly attaching an imaging layer to the exposed portions of the depolymerizable layer.

BACKGROUND OF THE INVENTION

This invention relates to an imaging process, and an imaging medium for use in this process. More specifically, this invention relates to an imaging process in which the image is formed by the change in cohesivity of a polymer upon depolymerization thereof.

Various imaging systems which rely upon the changes in physical properties accompanying polymerization of a monomer or oligomer are known. For example, U.S. Pat. No. 3,890,152 and U.S. Pat. No. 3,487,764, among others, describe a process in which a photosensitive layer is imagewise exposed, thus becoming less tacky, and then a powdered toner is spread over the photosensitive layer so that it adheres only to the unexposed, tacky regions of the layer, excess toner being mechanically removed from the layer. This type of process presents difficulties in handling the finely powdered toner required. In addition, the tacky surface of the unexposed photosensitive layer is highly susceptible to contamination with dust, fibers, fingerprints and the like, and any such contamination may cause unwanted artifacts in the image produced. Finally, in practice it is difficult to remove all the toner from the supposedly non-tacky areas of the image, since the toner may tend to adhere to these areas because of residual tackiness or electrostatic forces.

U.S. Pat. No. 4,356,252 describes a negative working tonable element having a photosensitive layer comprising a binder, a photosensitive acid generator and a polymeric or monomeric acetal. Upon exposure, the photosensitive acid generator generates acid, thereby causing depolymerization or polymerization of the acetal, so rendering the exposed regions tacky. The exposed photosensitive layer is then dusted with powdered toner, which adheres only to the tacky exposed regions, to form an image. This process suffers from problems with toner handling and toner removal similar to those experienced by the processes discussed in the preceding paragraph.

U.S. Pat. No. 4,910,120 describes a color proofing process in which a colored photosensitive layer containing a polymerizable material and a polymerization initiator is disposed between two other layers such that upon imagewise exposure of the photosensitive layer and peeling apart of the two other layers, the exposed regions stay with a first one of the two other layers while the unexposed regions stay with the second one of the two layers.

U.S. Pat. Nos. 4,145,216 and 4,081,282 both describe a dry transfer image system. This system comprises a first carrier film, a tacky photopolymerizable layer, a colored layer and a second carrier film. Upon imagewise exposure through the first carrier film, the photopolymerizable layer photopolymerizes in the exposed regions, thereby rendering it less tacky. Thereafter, the two films are separated, so that in the unexposed regions the colored layer remains with the first film, but in the exposed regions the colored layer remains with the second film.

U.S. Pat. No. 4,806,451 describes a color proofing process in which a photosensitive layer is exposed to produce imagewise tacky and non-tacky areas, and the exposed layer is brought into contact with a non-photosensitive transfer layer containing a finely divided powder or dissolved dye, so that the transfer layer adheres selectively to the tacky areas.

Imaging processes which rely upon polymerization of a monomer or oligomer suffer from several problems. In practice, it is difficult to secure complete polymerization within the limited exposure periods required in imaging. As a monomer or oligomer polymerizes, its viscosity increases, and this rise in viscosity reduces diffusion of monomer or oligomer to polymerization centers. Consequently, as the degree of polymerization increases, the polymerization reaction slows down, and thus it is difficult to remove the last traces of monomer or oligomer from the polymerizing mixture.

Polymerization reactions are often influenced by environmental conditions. Free radical polymerization is inhibited by oxygen, while acid catalyzed cationic polymerization is inhibited by water and other nucleophiles, such as halide ions. In practice, it is usually necessary to store an imaging medium for substantial periods between its production by the manufacturer and its use by a customer, and unless elaborate and expensive precautions are taken, atmospheric oxygen and water may be present in unpredictable amounts in the polymerizable layer of the imaging medium when it is used. Furthermore, monomers useful for the production of polymers tend to be highly reactive, and hence tend to be toxic, volatile and unstable under prolonged storage. Consequently, it is difficult to control the sensitivity and reproducibility of an imaging medium which relies upon polymerization for formation of an image.

Imaging systems are known which rely upon depolymerization of a polymer rather than polymerization of a monomer or oligomer, and several such depolymerization systems are described in M. W. Ranney, Specialized Curing Methods for Coatings and Plastics, Noyes Data Corporation, Park Ridge, N.J. (1977). For example, in one such system described by Ranney and in U.S. Pat. Nos. 3,915,704 and 3,917,483, an acid-degradable polymer is admixed with a photochemical acid generator, so that, upon exposure of the mixture to radiation, generation of acid and consequent degradation of the polymer will produce a visibly discernable image. Both patents mention that, if only about 25-40% of the acid degradable polymer is present, degradation of the polymer results in plasticizing the exposed regions, which can then be selectively removed by contacting the exposed polymer layer with a sheet of paper, which pulls the exposed regions away from the unexposed, the paper thereafter being treated with a conversion fluid to form a printing plate. Finally, both patents discuss the use of color-forming reagents in conjunction with the acid generator and polymer to form colored images.

International Patent Application No. PCT/US87/03249 (Publication No. WO 88/04237; the disclosure of this Application is incorporated herein by reference) describes a thermal imaging medium and a process for forming an image in which a layer of a porous or particulate imaging material (preferably, a layer of carbon black) is deposited on a heat-activatable image-forming surface of a first sheet-like or web material (hereinafter the "first sheet element"), the layer having a cohesive strength greater than its adhesive strength to the first sheet-like element. Portions of this thermal imaging medium are then exposed to brief and intense radiation (for example, by laser scanning), to firmly attach exposed portions of the imaging material to the first sheet element. Finally, those portions of the imaging material not exposed to the radiation (and thus not firmly attached to the first sheet element) are removed, thereby forming a binary image comprising a plurality of first areas where the imaging material is adhered to the first sheet-like element and a plurality of second areas where the first sheet-like element is free from the imaging material.

In a preferred embodiment of the imaging medium described in the aforementioned International Application, the imaging material is covered with a second laminated sheet-like element so that the imaging material is confined between the first element and this second element. After imaging and separation of the second element (with the unexposed portions of the imaging material) from the first element, a pair of images is obtained.

A first image comprises exposed portions of image-forming substance more firmly attached to the first element by heat activation of the heat-activatable image-forming surface. A second image comprises non-exposed portions of the image-forming substance carried or transferred to the second sheet element.

In the copending application Ser. No. 07/616,982, filed Nov. 21, 1990 by Kuang C. Chang entitled "Thermal imaging medium", there is described a variation of the process described in the aforementioned International Application; in this variation, a thermoplastic intermediate layer is disposed between the heat-activatable image-forming surface and the layer of porous or particulate imaging material. On separation of the sheets after thermal imaging, the thermoplastic intermediate layer adheres preferentially to the surface of the image formed by the non-exposed porous or particulate imaging material (i.e., the intermediate thermoplastic layer fractures and transfers with the porous or particulate imaging material) and provides surface protection for this image and improved handling, durability and abrasion-resistance characteristics.

In the aforementioned preferred embodiment of the process described in the aforementioned International Application (in which the imaging material is sandwiched between two sheet-like elements), it is usually highly desirable to provide a release layer between the imaging material and the second element in order to facilitate release of the exposed areas of imaging material from the second element, since such facile release of the exposed areas helps to ensure a high quality image. Furthermore, for technical reasons, in some applications it is desirable to use a "write white" imaging process, that is to say a process in which the exposed areas appear white in the final image. In the process described in the aforementioned International Application, it is the image formed on the second element which is the "write white" image; hence, where an image of such character is desired, the image on the second element can be retained and used. The second element still contains the release layer beneath the areas of imaging material, and this release layer may be the weakest layer of the image. Consequently, if the image on the second element is subjected to severe mechanical stress, in some cases the image may tend to delaminate at the release layer.

This invention relates to an alternative to the process described in the aforementioned International Application in which, instead of exposure firmly attaching an imaging material to a heat activatable surface, image formation is caused by loss of cohesive strength in a depolymerizable layer. The present invention permits the formation of a "write white" image which does not contain a release layer, any release layer present being discarded in the "write black" image.

SUMMARY OF THE INVENTION

Accordingly, this invention provides a first imaging process comprising:

providing a polymeric, depolymerizable layer which, upon exposure to actinic radiation, becomes at least partially depolymerized, the depolymerizable layer undergoing a reduction in cohesivity upon at least partial depolymerization of the polymer;

providing a layer of an imaging material on the depolymerizable layer, the layer of the imaging material having a cohesive strength greater than the cohesive strength of the depolymerizable layer after at least partial depolymerization of the polymer but less than the cohesive strength of the depolymerizable layer prior to depolymerization of the polymer, thereby providing an imaging medium;

imagewise exposing portions of the imaging medium to actinic radiation, thereby causing at least partial depolymerization of the polymer in the exposed areas of the depolymerizable layer and rendering these exposed areas lower in cohesivity than the unexposed areas; and applying to the layer of imaging material a separating force sufficient to remove the imaging material from the exposed areas of the depolymerizable layer, but insufficient to remove the imaging material from the unexposed areas of the depolymerizable layer, and thus forming an image.

This invention also provides an imaging medium comprising:

a polymeric, depolymerizable layer which, upon exposure to actinic radiation, becomes at least partially depolymerized, the depolymerizable layer undergoing a reduction in cohesivity upon at least partial depolymerization of the polymer; and a layer of a porous or particulate imaging material on the depolymerizable layer, the layer of the imaging material having a cohesive strength greater than the cohesive strength of the depolymerizable layer after at least partial depolymerization of the polymer, but less than the cohesive strength of the depolymerizable layer prior to depolymerization of the polymer.

Finally, this invention provides a second imaging process comprising:

providing a polymeric, depolymerizable layer which, upon exposure to actinic radiation, becomes at least partially depolymerized, the depolymerizable layer undergoing a reduction in cohesivity upon at least partial depolymerization of the polymer;

providing a layer of an imaging material on the depolymerizable layer, the layer of the imaging material having a cohesive strength greater than the cohesive strength of the depolymerizable layer after at least partial depolymerization of the polymer but less than the cohesive strength of the depolymerizable layer prior to depolymerization of the polymer, thereby providing an imaging medium;

imagewise subjecting portions of the imaging medium to exposure to radiation, thereby causing at least partial depolymerization of the polymer in the exposed areas of the depolymerizable layer and rendering these exposed areas lower in cohesivity than the unexposed areas;

separating the layer of imaging material from the unexposed areas of the depolymerizable layer such that the exposed areas of the depolymerizable layer undergo cohesive failure, with part of the depolymerizable layer in these exposed areas remaining with the layer of imaging material;

contacting the layer of imaging material and the portions of the depolymerizable layer attached thereto with an adhesive surface such that the imaging material adheres more strongly to the adhesive surface than do the portions of the depolymerizable layer; and applying to the layer of imaging material a separating force sufficient to remove from the adhesive surface the exposed areas of the imaging material and at least part of the portions of the depolymerizable layer associated therewith, but insufficient to remove from the adhesive surface the unexposed areas of the imaging material, and thus forming an image.

BRIEF DESCRIPTION OF THE DRAWINGS

FIGS. 5 to 8 show sections through the media used in a second, indirect process of the present invention at various states in the indirect process.

DETAILED DESCRIPTION OF THE INVENTION

Figure 1:
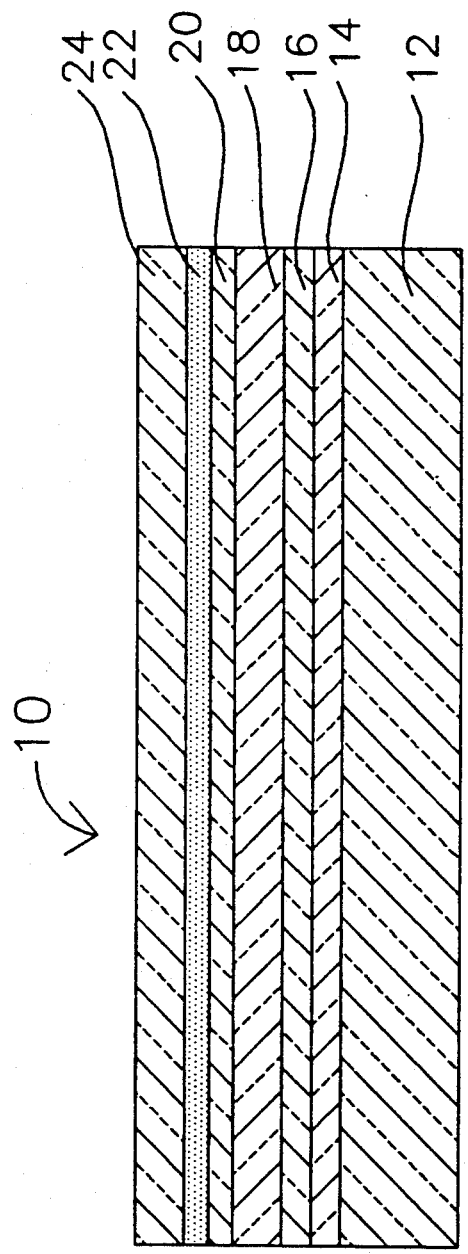
FIG. 1 of the accompanying drawings shows in section a first imaging medium of the invention in which the layer of imaging material comprises only a single layer of porous or particulate material.

As already mentioned, in the first (or direct) process of the present invention, a polymeric, depolymerizable layer is disposed adjacent a layer of an imaging material, so providing an imaging medium, which is imagewise exposed to radiation, thereby causing at least partial depolymerization of the polymer in the exposed areas of the depolymerizable layer, and reducing the cohesivity of these exposed areas. Finally, a separating force is applied to the layer of imaging material, thus removing the imaging material from the exposed areas of the depolymerizable layer but leaving the imaging material attached to the unexposed areas of the depolymerizable layer. It will be appreciated that, in such a direct process, the adhesion of the imaging material to the depolymerizable layer must be great enough to ensure that, when the separating force is applied in the unexposed areas, the imaging material remains attached to the depolymerizable layer so that the layer of imaging material fractures at the boundaries between the exposed and unexposed areas, rather than the whole layer of imaging material separating from the depolymerizable layer.

If, because of the nature of the imaging material required in a particular application (for example, to secure an imaging material which is opaque to a specific type of radiation), or because of the nature of the depolymerizable layer, it is difficult to secure sufficient adhesion of the imaging material to the depolymerizable layer, the indirect process of the invention may be employed. In this indirect process, the depolymerizable layer and layer of imaging material are imaged in the same way as in the direct process. However, after exposure, the imaging material is separated from the depolymerizable layer such that the exposed areas of the depolymerizable layer undergo cohesive failure, with part of the depolymerizable layer in these exposed areas remaining with the layer of imaging material.

The layer of imaging material and the attached portions of the depolymerizable layer are then contacted with an adhesive surface such that the imaging material adheres more strongly to the surface than do the attached portions of the depolymerizable layer. Finally, there is applied to the layer of imaging material a separating force sufficient to remove from the adhesive surface the exposed areas of the imaging material and at least part of the portions of the depolymerizable layer associated therewith, but insufficient to remove from the adhesive surface the unexposed areas of the imaging material, thus forming an image.

In the following description, the details of the invention will be described principally with reference to the direct process since the necessary modifications to carry out the indirect process will readily be apparent to those skilled in the art.

In a preferred process of the invention, the imaging medium further comprises a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after exposure to the radiation, but less than the cohesive strength of the depolymerizable layer prior to exposure to the radiation, and the separating force is applied by separating the first and second support sheets, thereby producing a pair of images on the two support sheets. This pair of images are complementary in that a white area on one image corresponds to a black area on the other. Although either or both of the pair of images may be retained, in general it is preferred to retain the image on the first support sheet, since this image does not contain any release layer. Furthermore, if the layer of imaging material includes a thermoplastic layer (see below), it is the image on the first support sheet which is protected by this thermoplastic layer.

Desirably, a release layer is disposed between the second support sheet and the imaging material layer, such that upon separation of the first and second support sheets following exposure of areas of the imaging medium to the radiation, failure occurs within or on one surface of the release layer.

The depolymerizable polymer used in the present process may be any polymer or mixture of polymers, alone or in admixture with low molecular weight materials, which polymer or mixture has good cohesivity in its polymeric form, but which undergoes substantial reduction in cohesive strength upon at least partial depolymerization. Preferred polymers are polyaldehydes and polycarbonates. The polyaldehydes used may be homo- or copolymers of aliphatic or aromatic aldehydes, or copolymers of such aldehydes with other, non-aldehyde monomers, for example styrene. Such polyaldehydes are well-known to those skilled in the art; see, for example, Vogl, Polymer, 21, 1433 (1980) and U.S. Pat. Nos. 3,915,706; 3,923,514 and 3,964,907. The polyaldehydes are conventionally prepared by ionic polymerization of the aldehyde in the cold and capping, typically with acetic anhydride. Precipitation of the polymer by standard methods gives polyaldehydes stable enough for long term storage and having a number average molecular weight generally in the range of 70,000 to 200,000. Especially preferred polyaldehydes for use in the present process are poly(o-phthalaldehyde) and polybutyraldehyde. Appropriate polycarbonates are described in, for example, Frechet, J. M. J. et al, J. Imaging Sci., 30(2), 59 (1986).

The polymeric, depolymerizable layer may comprise a polymer containing photosensitive groups such that, upon photoreaction of the photosensitive groups, the polymer at least partially depolymerized. For example, polymers are known having photosensitive capping groups; upon removal of the capping group by radiation, the polymer depolymerizes.

Alternatively, the polymeric, depolymerizable layer may comprise a polymer which requires the presence of an auxiliary photosensitive material to initiate depolymerization. For example, the depolymerizable layer may comprise an acid generator which generates acid when exposed to the radiation, the polymer being such that it depolymerizes in the presence of acid. This type of process may use ultraviolet radiation having a wavelength in the range of about 180 to about 400 nm, in which case the acid generator is conveniently an onium salt, such as the salts disclosed in Devoe et al, Can. J. Chem., 66, 319 (1988); Crivello et al., Macromol., 10, 1307 (1977); J. Polym. Sci., Polym. Chem. Ed., 17, 977, 1047 and 2877 (1979); J. Polym. Sci., Polym. Chem. Ed., 18, 1021 (1980), or a poly(halogenated alkane), as disclosed for example in Sprague et al., Phot. Sci. Eng., 5, 98 (1961); Phot. Sci. Eng., 8, 95 (1964); Phot. Sci. Eng., 9, 133 (1965); and Fotland, J. Phot. Sci., 18, 33 (1970).

The depolymerizable layer may instead comprise a radiation absorber which generates heat when exposed to the radiation, and a thermochemical acid generator which generates acid when heated, the polymer being such that it depolymerizes in the presence of acid. This type of process is conveniently carried out using visible or infra-red radiation having a wavelength in the range of about 400 to about 1,200 nm; such infra-red radiation may be provided using a laser, preferably a semi-conductor laser when infra-red radiation is used. Dyes such as the azo dyes, xanthene dyes, phthalocyanine dyes or anthraquinone dyes can be employed as radiation absorbers in such a process. Especially preferred are materials which absorb efficiently at the particular wavelength of the exposing radiation. In this connection, infrared-absorbing dyes which absorb in the infrared-emitting regions of lasers which are desirably used for imaging are especially preferred. Suitable examples of infrared-absorbing dyes for this purpose include the alkylpyrylium-squarylium dyes, disclosed in U.S. Pat. No. 4,508,811 (issued Apr. 2, 1985 to D. J. Gravesteijn, et. al.), and including 1,3-bis[(2,6-di-t-butyl-4H-thiopyran-4-ylidene) methyl]-2,4-dihydroxydihydroxide-cyclobutene diylium-bis{inner salt}. Other suitable IR-absorbing dyes include 4-[7-(4H-pyran-4-ylide)hepta-1,3,5-trienyl]pyrylium tetraphenylborate and 4-[[3-[7-diethylamino-2-(1,1-dimethylethyl)-(benz[b]-4H-pyran-4-ylidene) methyl]-2-hydroxy-4-oxo-2-cyclobuten-1-ylidene]methyl]-7-diethylamino-2-(1,1-dimethylethyl)-benz[b]pyrylium hydroxide inner salt. These and other IR-absorbing dyes are disclosed in the commonly assigned patent application of Z. J. Hinz, et. al., Ser. No. 07/616,651, filed Nov. 21, 1990 entitled "Heptamethine Pyrylium Dyes, and Processes for Their Preparation and Use as Near Infra-Red Absorbers"; and in the commonly assigned and copending application of S. J. Telfer, et. al., Ser. No. 07/616,639, filed Nov. 21, 1990, entitled "Benzpyrylium Squarylium Dyes, and Processes for Their Preparation and Use".

Any of the known heat-sensitive materials which liberate acid upon heating may be used as the thermochemical acid generator in such a process. For example, Sabongi, G. J., Chemical Triggering—Reactions of Potential Utility in Industrial Processes, Plenum Press, New York, N.Y. (1987), pages 68–72 describes thermally triggered release of carboxylic acids from esters and oxime derivatives, especially benzaldoximes and oxalic acid esters. Other acid generators described in U.S. Pat. No. 4,916,046 include diazonium, phosphonium, sulfonium and iodonium salts, generally employed in the form of their organic solvent-soluble salts, usually as deposition products with complex acids such as tetrafluoroboric acid, hexafluorophosphoric acid, hexafluoroantimonic acid and hexafluoroarsenic acid; halogen compounds, in particular triazine derivatives; oxazoles, oxadiazoles, thiazoles or 2-pyrones which contain trichloromethyl or tribromomethyl groups; aromatic compounds which contain ring-bound halogen, preferably bromine; a combination of a thiazole with 2-benzoylmethylenenaphthol; a mixture of a trihalomethyl compound with N-phenylacridone; α-halocarboxamides; and tribromomethyl phenyl sulfones.

In addition to auxiliary agents required to cause depolymerization of the polymer upon exposure of the depolymerizable layer to radiation, the depolymerizable layer may also comprise other additives. For example, the depolymerizable layer may contain one or more sensitizers effective to sensitize the photosensitive component of the layer (the depolymerizable polymer itself, an acid generator or an absorber) to a particular wavelength of radiation which it is desired to use in exposing the imaging medium. By varying the type of polymer and auxiliary agents employed, the present process can be carried out using differing types of radiation.

In some cases, the depolymerizable layer may contain one or more plasticizers. Such plasticizers serve to lower the glass transition temperature ($T_g$) of the depolymerizable layer, and thus reduce the degree of depolymerization which must be effected to cause loss of cohesive strength in the depolymerizable layer. Hence, the addition of such plasticizers tends to increase the sensitivity of the imaging medium. However, the amount of plasticizer added must be carefully controlled to ensure that the cohesive strength of the polymer is not reduced too much prior to depolymerization.

Where depolymerization is effected by acid produced by an acid generator, it may be desirable to include in the imaging medium (in the same layer as the acid generator or, less desirably, in an adjacent layer) a small amount of base. Upon prolonged storage, many acid generators tend to generate small amounts of acid even though they are not exposed to radiation. By including a small amount of base in the imaging medium, these small amounts of acid generated during storage of the imaging medium prior to exposure can be neutralized, thereby avoiding undesired depolymerization of the depolymerizable layer prior to exposure. Exposure of the imaging medium produces a quantity of acid much larger than can be neutralized by the small quantity of base, so the presence of the base does not affect the imaging process. The base need not be present in the same layer as the acid generator, provided that acid generated during storage by the acid generator can diffuse to the base and be neutralized; during imaging, the rapid generation of acid by the acid generator ensures the presence of sufficient acid to effect the depolymerization, and thus the presence of the base does not affect the imaging process.

It should be noted that the present process does not depend upon any particular mechanism for the loss of cohesive strength of the depolymerizable layer, and reduction in cohesive strength may be achieved in several different ways. For example, the monomer released by partial depolymerization may reduce the cohesive strength of the remaining polymer, or the polymer may depolymerize to an oligomer which is inherently lacking in cohesive strength. When the depolymerizable layer comprises a mixture of polymers, the monomer released by depolymerization of one polymer may reduce the cohesive strength of one or more other polymers. Similarly, when the depolymerizable layer comprises a block copolymer derived from two or more different monomers, only the blocks derived from one monomer may depolymerize, leaving the blocks derived from a different monomer, which latter blocks may be inherently lacking in cohesive strength.

To secure high quality images from the present process, the amount of radiation impinging upon the imaging medium must be controlled. If too little radiation is applied to the medium, the exposed areas of the depolymerizable layer may simply become tacky, so that the imaging material adheres strongly to the exposed areas and part or all of the imaging material in the unexposed areas may be removed when the separating force is applied. Thus, under-exposure may cause unwanted artifacts in the image. The optimum degree of exposure will vary with a number of factors, including the composition of the depolymerizable layer, the wavelength of the radiation employed, etc., but the optimum degree of exposure for any specific imaging medium may readily be determined by routine empirical tests. Preferred imaging media of the present invention typically give high quality images at exposures of the order of 1 to 50 mJ cm$^2$.

It has been found that, at least in some imaging media of the present invention, substantial increases in sensitivity can be achieved if the imaging medium is heated during or after exposure to the radiation but before removal from the depolymerizable layer of the unexposed portions of the imaging material. Such heating may be effected, for example, by passing the exposed medium between heated rollers or heating the bed on which the medium rests during exposure. Typically, heating the exposed medium to a temperature of about 80° to about 120° C. for a period of about 10 to about 60 seconds provides a desirable increase in sensitivity. However, especially where the radiation used for exposure is infra-red radiation and the depolymerizable layer incorporates an infra-red absorber, the exposing radiation may generate sufficient heat within the imaging medium to render additional heating of the medium superfluous.

In some cases, it may be desirable to heat the image after removal of the unexposed portions of the imaging material in order to increase the stability of the image.

The layer of imaging material used in the present process may be simply a layer of a porous or particulate imaging material. Alternatively, where a pair of images are produced by the present process from an imaging medium having first and second sheet-like elements, as described above, the imaging material may comprise a layer of porous or particulate imaging material in contact with the depolymerizable layer and a thermoplastic layer disposed between the layer of porous or particulate imaging material and the second support sheet, the adhesion of the thermoplastic intermediate layer to the second support sheet being greater than the adhesion of the porous or particulate imaging material to the first sheet in the exposed areas but less than the adhesion of the porous or particulate imaging material to the first sheet in the unexposed areas. Thus, upon separation of the first and second support sheets, in the exposed areas both the layer of porous or particulate imaging material and the thermoplastic layer remain with the second support sheet, while in the unexposed areas both the layer of porous or particulate imaging material and the thermoplastic layer remain with the first support sheet. In the final image on the first sheet, the thermoplastic layer overlies and protects the areas of imaging material in the image, thus improving the handling, durability and abrasion resistance of the image. The thermoplastic layer, although applied in connection with an imaging mechanism different from that described in the aforementioned application Ser. No. 07/616,982, provides similar protection of the desired image.

Alternatively, where a pair of images are produced by the present process from an imaging medium having first and second sheet-like elements, as described above, either or both of the resultant images may be protected by:

providing a laminating sheet comprising a durable layer and a support layer;

placing the laminating sheet in contact with one of the images such that the durable layer faces the image and at least one portion of the laminating sheet extends beyond the periphery of the support layer carrying the image;

laminating the laminating sheet to the image so that the durable layer adheres to both the areas of the imaging material forming the image and the exposed areas of support sheet; and separating the support layer from the image such that the durable layer remains attached to the image, but, in said at least one portion of the laminating sheet, the durable layer remains attached to the support layer so that the durable layer breaks substantially along the periphery of the associated element, thereby covering the image with a durable layer, this layer:

a. being substantially transparent;

b. having an abrasion resistance of at least 10 cycles of a 10 Newton force as measured by an Erikson Abrasion Meter and a critical load value of at least 100 grams as measured by ANSI PH1.37-1983; and c. not being removed from the image by contact with adhesive tape having an adhesion to steel of 33 grams per millimeter, as measured by ASTM D-3330. This method of protecting an image is described in detail and claimed in copending and commonly assigned application Ser. No. 07/616,851, filed Nov. 21, 1990 of Agota Fehervari et al., and entitled "Protected image, and process for the production thereof".

As discussed in the copending and commonly assigned application Ser. No. 07/616,854, filed Nov. 21, 1990 of Neal F. Kelly, entitled "Stress-absorbing thermal imaging laminar medium", imaging media such as those of the present invention which contain layers of porous or particulate imaging material may exhibit an undesirable tendency to delaminate upon subjection to handling, cutting or other stress-inducing conditions or operations. When such an imaging medium is pre-disposed to stress-induced adhesive failure at the interface therein having the weakest adhesivity, the tendency towards such predisposed adhesive failure may be reduced by providing a polymeric stress-absorbing layer in close proximity to this interface, the polymeric stress-absorbing layer being capable of absorbing physical stress applied to the imaging medium. Where a pair of images are produced by the present process from an imaging medium having first and second sheet-like elements, the stress-absorbing layer may be disposed, for example, between the depolymerizable layer and the first sheet, or between the second sheet and a release layer provided thereon.

The imaging process and medium of the present invention have a number of advantages over prior art imaging systems which rely upon polymerization reactions. As discussed above, most polymerization reactions are auto-inhibited because the viscosity increase which accompanies polymerization reduces the ability of monomer or oligomer molecules to diffuse to polymerization centers, thus reducing the polymerization rate. In contrast, no such auto-inhibition is experienced with the depolymerization reactions used in the present process. Indeed, preferred processes of the invention can be made highly sensitive to radiation, since certain polyaldehydes and polycarbonates are thermodynamically unstable to depolymerization. In such cases, radiation is only required to initiate a strand scission (which may occur either by removal of a capping group or within the polymer chain); once the scission has occurred, the remainder of the polymer chain spontaneously depolymerizes, so that a single quantum can cause depolymerization of a long polymer chain.

The depolymerization reactions used in the present process are also less susceptible to inhibition by materials normally present in the environment than are polymerization reactions. As noted above, radical polymerization reactions are inhibited by oxygen, while acid catalyzed polymerization reactions are inhibited by water and nucleophiles such as halide, and complete exclusion of both oxygen, water and other nucleophiles from a polymerization reaction is nearly impossible in practice. In contrast, the depolymerization of the preferred polyaldehydes and polycarbonates is not inhibited by oxygen and is only inhibited to a minor degree by water and nucleophiles. Consequently, the imaging media of the present invention can be stored for extended periods before exposure without the need to take elaborate precautions to exclude oxygen and water.

The present process also permits the use of a wide range of exposing radiation, including ultraviolet, visible and infra-red radiation. To secure high-resolution images, it is highly desirable to be able to use a laser as the source of exposing radiation, and the ability of the present process to use infra-red radiation in the range of about 800 to about 1,200 nm allows the process to be carried out using inexpensive semi-conductor lasers; ultraviolet lasers such as would be required by some prior art polymerization processes are much more expensive than infra-red semi-conductor lasers.

Incidentally, we have found empirically that many infra-red dyes strongly inhibit radical polymerization reactions. Consequently, even if one attempted to effect imaging using a polymerization reaction and infra-red radiation, selection of an appropriate infra-red dye would pose difficulties, and there would be a high risk of substantial amounts of monomer being left in the product.

Finally, it is highly doubtful whether in practice satisfactory images could be obtained from a polymerization imaging process using the porous or particulate imaging materials which can be used in the present process. If a layer of such a porous or particulate imaging material is in contact with a monomeric or oligomeric layer for a period of several weeks or months, such as typically occurs during storage of an imaging medium before use, the monomer or oligomer will tend to diffuse into the imaging material, and the imaging material may also tend to be pressed into the monomeric or oligomeric layer, especially since the imaging medium will typically be stored in the form of a stack of sheets, in which the lower sheets are under substantial compression. Either effect will cause an intermingling of the adjacent parts of the two layers such that, upon imaging and polymerization, in the exposed areas, part of the imaging material will be held in the polymerized layer rather than being removed therefrom, with consequent deleterious effects upon the quality of the image produced. In the present process, the imaging material is stored in contact with a polymeric layer, which is essentially non-mobile, so there is no tendency for the polymeric layer to become intermixed with the imaging material.

The adhesive surface used in the indirect process of the present invention can be formed from a wide variety of known tacky materials. In this indirect process, the removal of the exposed areas of the imaging material from the adhesive surface normally takes place by cohesive failure within the portions of the depolymerizable layer attached to the exposed areas. Accordingly, the only requirement placed upon the adhesive surface is that its adhesion to the unexposed areas of the imaging material be sufficient to keep these unexposed areas attached to the adhesive surface under the relatively small separating force required to cause cohesive failure within the portions of the depolymerizable layer attached to the exposed areas. In practice use of an adhesive surface formed from tacky polymers such as those used in commercial adhesive tapes readily meets this requirement.

Figure 2:
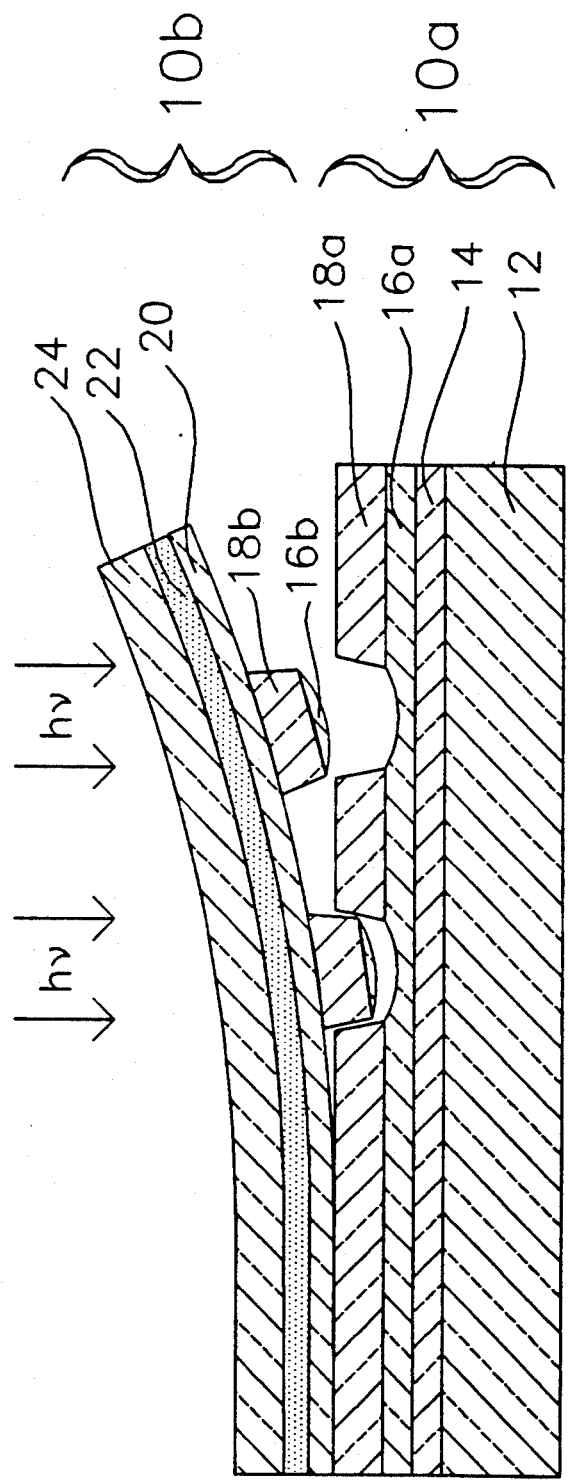
FIG. 2 shows a section, similar to that of FIG. 1, through the first imaging medium as the first and second elements thereof are being separated to form a pair of complementary images.

In FIG. 1, there is shown a preferred laminar medium material 10 suited to production of a pair of images, shown as images 10a and 10b in a state of partial separation in FIG. 2. Imaging medium 10 includes a first sheet-like web material 12 having superposed thereon, and in order, stress-absorbing layer 14, depolymerizable layer 16, imaging layer 18, release layer 20, adhesive layer 22 and second sheet-like web material 24.

Upon exposure of imaging medium 10 to radiation, exposed areas of depolymerizable layer 16 are reduced in cohesive strength, so that, upon separation of the respective sheet-like web materials, as shown in FIG. 2, these exposed areas undergo cohesive failure leaving portions 16b of the depolymerizable layer adhering to exposed regions 18b of the imaging layer while the remainder 16a of the depolymerizable layer remains attached to the stress-absorbing layer 14, with consequent fracturing of the imaging layer 18, and formation of a pair of images, 10a and 10b. The nature of certain of the layers of imaging medium 10 and their properties are importantly related to the manner in which the respective images are formed and partitioned from the medium after exposure. The various layers of medium 10 are described in detail hereinafter.

Sheet-like web material 12 comprises a transparent material through which imaging medium 10 can be exposed to radiation. Web material 12 can comprise any of a variety of sheet-like materials, although polymeric sheet materials are preferred. Among preferred web materials are polystyrene, poly(ethylene terephthalate), polyethylene, polypropylene, poly(vinyl chloride), polycarbonate, poly(vinylidene chloride), cellulose acetate, cellulose acetate butyrate and copolymeric materials such as the copolymers of styrene, butadiene and acrylonitrile, including poly(styrene-co-acrylonitrile). An especially preferred web material from the standpoints of durability, dimensional stability and handling characteristics is poly(ethylene terephthalate), commercially available, for example, under the tradename Mylar, of E. I. duPont de Nemours & Co., or under the tradename Kodel, of Eastman Kodak Company.

Stress-absorbing layer 14 reduces any tendency towards delamination of medium 10 at the weakest adhesive interface, i.e., at the interface between release layer 20 and imaging layer 18. Failure at the interface can be effected unintentionally by applying stress or mechanical shock to medium 10. Delamination at the interface of layers 20 and 18, whether occurring during manufacturing operations, such as cutting or slitting operations, or in the course of handling of the medium material in a printer or other imaging device, effectively destroys the imageability and usefulness of the imaging medium 10.

Layer 14 comprises a polymeric layer having the capacity to absorb compressive force or to undergo an elastic stretching. Typically, an imaging medium of the type described herein will comprise a pair of sheets of differing thicknesses. The medium can, therefore, be readily flexed or bent, with creation of stresses in the medium which tend to cause delamination thereof. Layer 14 serves to absorb these stresses so as to minimize this undesirable tendency to delamination.

A variety of polymeric materials can be used to provide a stress-absorbing layer 14. In general, layer 14 will comprise a polymeric material having a soft and compressible or elongatable character. Useful polymers will also typically be thermoplastic, although a thermoplastic character will not be a prerequisite. Among polymers useful for the provision of stress-absorbing layer 14 are the copolyesters, such as those prepared by reaction of a glycol or other polyol (e.g., ethylene glycol, glycerol) with an aliphatic or aromatic dicarboxylic acid (or lower alkyl ester thereof) such as terephthalic, isophthalic, adipic or sebacic acid; vinylidene chloride polymers, such as vinylidene chloride/vinyl acetate copolymers; ethylene polymers, such as ethylene/vinyl acetate copolymers; vinyl chloride polymers, such as vinyl chloride/vinyl acetate copolymers; poly(vinyl acetals), such as poly(vinyl butyral); acrylate copolymers, such as poly(methyl methacrylate-co-butyl methacrylate); synthetic rubber polymers, such as styrene/butadiene; styrene polymers, such as poly(styrene) and poly(styrene-co-butadiene-co-acrylonitrile); and polyurethanes.

Among preferred polymeric materials for layer 14 are the elastomeric polymers such as the elastomeric polyurethanes, examples of which are known in the art, and which can be obtained from an aliphatic polyol, an aromatic diisocyanate and a chain-extending agent. Preferred and commercially available polyurethanes are the polyurethanes available as ICI XR-9619 and XR-9637 polyurethanes (from ICI Resins US, Wilmington, Mass.). Other polyurethanes can, however, be employed. Other preferred polymeric materials for layer 14 are the copolyesters of alkylene glycols (e.g., ethylene glycol and 1,4-butanediol) and aromatic terephthalic and isophthalic acids, commercially available, for example, as Bostik 7915 and 7975, from Bostik, Inc., Division of Total Chemie.

The characteristics of the depolymerizable layer 16 and the preferred materials for use therein have already been described in detail and will not be repeated here. Essentially, the depolymerizable layer 16 must, in its polymeric form, have substantial cohesive strength, which must decrease significantly upon exposure to radiation, and the adhesion of the imaging layer 18 to the depolymerizable layer 16 prior to depolymerization must be greater than the adhesion of the imaging layer 18 to the second sheet 24. Thus, as shown in FIG. 2, when the sheets 12 and 24 are separated, in the non-exposed regions cohesive failure occurs within or on one surface of the release layer 20, and the non-exposed portions 18a of the imaging layer 18 remain attached to the depolymerizable layer 16 and the first sheet 12. However, upon exposure to radiation, the polymer in the layer 16 partially depolymerizes, thereby reducing the cohesive strength of the layer 16. Consequently, in the exposed regions, as shown in FIG. 2, when the sheets 12 and 24 are separated, depolymerizable layer 16 undergoes cohesive failure.

The exposing radiation may be applied from either side of the imaging medium 10. Where the imaging layer 18 is substantially transparent to the radiation, the radiation is preferably directed onto the depolymerizable layer 16 through the sheet 24 and the layers 22, 20 and 18, as shown in FIG. 2. Exposing in this direction ensures that maximum absorption of radiation occurs in the part of the depolymerizable layer 16 adjacent the imaging layer 18, where such absorption may be most effective in causing the layer 18 to separate from the layer 16. However, if the imaging layer 18 is made of a material (such as carbon black) which strongly absorbs the radiation, exposure may be made through the sheet 12 and the layer 14.

The depolymerizable layer 16 need only be thick enough to permit good separation of the imaging layer 18 in the exposed areas. Consequently, the depolymerizable layer 16 can be made very thin, typically in the range of about 0.1 to about 5 $\mu$m. The use of a thin layer 16 is generally useful to permit optimal imaging and reduced radiation energy requirements. If, for example, the medium 10 is exposed through the sheet 12 and the depolymerizable layer 16 contains a strong absorber of the radiation, if the layer 16 is made too thick, most of the radiation may be absorbed in the part of the layer 16 adjacent the stress-absorbing layer 14, with only a small proportion of radiation reaching the part of the layer 16 adjacent the imaging layer 18. Under these circumstances, little depolymerization of the part of the layer 16 adjacent the layer 18 will occur, and the continuous layer of non-depolymerized polymer adjacent the imaging layer 18 may hinder the desired cohesive failure of the depolymerizable layer 16. Obviously, this problem is less likely to be encountered if exposure is made through the sheet 24.

Because depolymerization of the part of the layer 16 adjacent the imaging layer 18 will suffice for imaging, several variations can be made in the imaging process of the invention. For example, when the layer 16 comprises a acid-depolymerizable polymer and a thermochemical acid generator, normally it is necessary to include in the imaging medium a radiation absorber which converts infra-red exposing radiation to heat, thus initiating the thermochemical generation of acid. However, in some cases, if exposure is made through the sheet 12, it may be possible to include the radiation absorber in the imaging layer 18 rather than in the depolymerizable layer 16, so that the heat generated by absorption of radiation in the layer 18 adjacent the depolymerizable layer 16 will cause depolymerization of the latter. Indeed, if the imaging material in the layer 18 is of a type which strongly absorbs infra-red radiation (for example, carbon black), so that exposure has to be made through the sheet 12, it may be possible to eliminate the radiation absorber and rely upon the heat generated by the imaging material in the exposed areas to cause depolymerization of the depolymerizable layer 16 in those areas.

Image-forming layer 18 comprises an image-forming substance deposited onto layer 16 as a porous or particulate layer or coating. Layer 18, referred to as a colorant/binder layer, can be formed from a colorant material dispersed in a suitable binder, the colorant being a pigment or dye of any desired color, and if necessary substantially inert to any elevated temperatures generated during imaging of medium 10. Carbon black is a particularly advantageous and preferred pigment material. Preferably, the carbon black material will comprise particles having an average diameter of about 0.01 to 10 $\mu$m. Although the description hereof will refer principally to carbon black, other optically dense substances, such as graphite, phthalocyanine pigments and other colored pigments can be used. If desired, substances which change their optical density upon subjection to elevated temperatures can also be employed.

The binder for the image-forming substance of layer 18 provides a matrix to form the porous or particulate substance thereof into a cohesive layer and serves to adhere layer 18 to layer 16. Layer 18 can be conveniently deposited onto layer 16 using any of a number of known coating methods. According to a preferred embodiment, and for ease in coating layer 18 onto layer 16, carbon black particles are initially suspended in an inert liquid vehicle (typically, water) and the resulting suspension or dispersion is uniformly spread over layer 16. On drying, layer 18 is adhered as a uniform image-forming layer onto the surface of layer 16. It will be appreciated that the spreading characteristics of the suspension can be improved by including a surfactant, such as ammonium perfluoroalkyl sulfonate, nonionic ethoxylate or the like. Other substances, such as emulsifiers, can be used or added to improve the uniformity of distribution of the carbon black in its suspended state and, thereafter, in its spread and dry state. Layer 18 can vary in thickness and typically will have a thickness of about 0.1 to about 10 $\mu$m. In general, it will be preferred, from the standpoint of image resolution, that a thin layer be employed. Layer 18 should, however, be of sufficient thickness to provide desired and predetermined optical density in the images prepared from imaging medium 10.

Suitable binder materials for image-forming layer 18 include gelatin, poly(vinyl alcohol), hydroxyethyl cellulose, gum arabic, methyl cellulose, polyvinylpyrrolidone, polyethyloxazoline, polystyrene latex and poly(styrene-co-maleic anhydride). The ratio of pigment (e.g., carbon black) to binder can be in the range of from 40:1 to about 1:2 on a weight basis. Preferably, the ratio of pigment to binder will be in the range of from about 4:1 to about 10:1. A preferred binder material for a carbon black pigment material is poly(vinyl alcohol).

If desired, additional additives or agents can be incorporated into imaging layer 18. Thus, submicroscopic particles, such as chitin, polytetrafluoroethylene particles and/or polyamide can be added to layer 18 to improve abrasion resistance. Such particles can be present, for example, in amounts of from about 1:2 to about 1:20, particles to layer solids, by weight.

As can be seen from FIG. 2, the relationships of adhesivity and cohesivity among the several layers of imaging medium 10 are such that separation occurs within or on one surface of the release layer 20 in non-exposed regions. (In FIG. 2, for ease of illustration, the separation is shown as occurring at the surface of release layer 20 in contact with imaging layer 18.) Thus, imaging medium 10, if it were to be separated without exposure, would separate at layer 20 to provide a $D_{min}$ on sheet 24. The nature of layer 16 is such, however, that its cohesive strength is substantially reduced upon exposure. Thus, as shown in FIG. 2, exposure of medium 10 to radiation in the direction of the arrows and in the areas defined by the respective pairs of arrows, serves to reduce the cohesive strength of layer 16, so that in exposed regions, when sheets 12 and 24 are separated, failure occurs within layer 16, leaving portions 16b thereof attached to the sheet 24 while the remainder 16a of the depolymerizable layer 16 remains attached to the sheet 12.

As shown in FIG. 2, exposed regions or portions 18b of imaging layer 18 separate sharply from non-exposed portions 18a of layer 18. Layer 18 is an imagewise disruptible layer owing to the porous or particulate nature thereof and the capacity for the layer to fracture or break sharply at particle interfaces. From the standpoint of image resolution or sharpness, it is essential that layer 18 be disruptible, such that a sharp separation can occur between exposed and unexposed regions of the imaged medium, through the thickness of the layer 18 and along a direction substantially orthogonal to the interface of the layers 18 and 16, i.e., substantially along the direction of the arrows in FIG. 2.

Shown in imaging medium 10 is a second sheet-like web material 24 covering image-forming layer 18 through adhesive layer 22 and release layer 20. Sheet 24 is laminated over image-forming layer 18 and serves as the means by which exposed areas of layer 18 can be carried from sheet 12 in the form of image 10b, as shown in FIG. 2. Sheet 24 can comprise any of a variety of plastic, paper or other materials, depending upon the particular application for image 10b. Thus, a paper sheet material 24 can be used to provide a reflective image. In many instances, a transparency will be preferred, in which case, a transparent sheet 24 will be employed. A polyester (e.g., poly(ethylene terephthalate)) sheet material is a preferred material for this purpose.

In general, the thicknesses of the sheets 12 and 24 will depend upon the desired handling characteristics of medium 10 during manufacture, on imaging and post-imaging separation steps, and on the desired and intended use of the image to be carried on these sheets. For example, if the image is to be used in contact printing using divergent light (e.g., for the production of duplicate color separations in the graphics art industry), it may be necessary to limit the thickness of the sheet upon which the image is formed in order that the resolution of the contact print is not adversely affected. The thicknesses may also be influenced by exposure conditions, such as the power of the exposing source of radiation. As already mentioned, when the sheets 12 and 24 are separated following exposure, a pair of complementary images are formed on the two sheets. Either or both of these images may be retained. However, in general one of the images (the "keeper") will be retained and the other image (the "throw-away") discarded. For technical reasons, in some applications it is desirable to use a "write white" imaging process, that is to say a process in which the exposed areas appear white in the final image. In the imaging medium 10, it is the image formed on the sheet 12 which is the "write white" image, and hence it is this image on the sheet 12 which is the keeper and normally retained and used. Thus, the sheet 12 should be thick enough to withstand normal handling in use. Typically, sheet 12 will vary in thickness from about 2 to 20 mil (51 to 510 $\mu$m). Good results can be obtained using a polymeric sheet 12 having a thickness of about 5 mil (127 $\mu$m) to about 10 mil (254 $\mu$m), although other thicknesses can be employed. The throw-away sheet 24, on the other hand, can be made thinner since it does not need to withstand extensive handling after exposure. Good results can be obtained using a polymeric sheet 24 having a thickness of about 0.75 mil (19 $\mu$m) to about 7 mil (178 $\mu$m) although other thicknesses can be employed.

Preferably, sheet 24 will be provided with a layer of adhesive to facilitate lamination. Adhesives of the pressure-sensitive, heat-activatable and radiation-activatable types can be used for this purpose. Typically, sheet 24 carrying adhesive layer 22 will be laminated onto sheet 12 using pressure (or heat and pressure) to provide a unitary lamination. Suitable adhesives include poly(ethylene-co-vinyl acetate), poly(vinyl acetate), poly(ethylene-co-ethyl acrylate), poly(ethylene-co-methacrylic acid) and polyesters of aliphatic or aromatic dicarboxylic acids (or their lower alkyl esters) with polyols such as ethylene glycol, and mixtures of such adhesives.

The properties of adhesive layer 22 can vary in softness or hardness to suit particular requirements of handling of the imaging medium during manufacture and use and image durability. A soft adhesive material of suitable thickness to provide the capability of absorbing stresses that may cause an undesired delamination can be used, as is disclosed and claimed in the aforementioned application Ser. No. 07/616,854. If desired, a hardenable adhesive layer can be used and cutting or other manufacturing operations can be performed prior to hardening of the layer, as is described in the commonly assigned patent application of Neal F. Kelly, et al., entitled "Hardenable Adhesive for Thermal Imaging Medium", Ser. No. 07/616,853, filed Nov. 21, 1990.

According to a preferred embodiment, and as shown in FIG. 1, release layer 20 is included in imaging medium 10 to facilitate separation of images 10a and 10b according to the mode shown in FIG. 2. As described hereinbefore, regions of imaging layer 18 not subjected to radiation remain adhered to layer 16. Because of the reduction in cohesive strength of layer 16, exposed portions 18b of layer 18 are carried along with sheet 24 on separation of sheets 12 and 24. This is accomplished by the cohesive strength of layer 16, in exposed regions, being less than: (a) the adhesion between layers 18 and 20; (b) the adhesion between layers 20 and 22; (c) the adhesion between layer 22 and sheet 24; and (d) the cohesivity of layers 18, 20 and 22. The adhesion of sheet 24 to porous or particulate layer 19, while sufficient to remove exposed portions 18b of layer 18 from layer 16, is controlled, in non-exposed areas, by release layer 20 so as to prevent removal of firmly attached non-exposed portions 18a of layer 18.

Release layer 20 is designed such that its cohesivity or its adhesion to either adhesive layer 22 or porous or particulate layer 18 is less, in non-exposed areas, than the adhesion of layer 18 to layer 16. The result of these relationships is that release layer 20 undergoes an adhesive failure in non-exposed areas at the interface between layers 18 and 20, or at the interface between layers 20 and 22 or a cohesive failure of layer 20 occurs, such that portions are present in image 10b and portions are adhered in exposed regions to porous or particulate layer 18. Any portions of release layer 20 remaining with layer 18 may serve to provide some surface protection for the image areas of image 10a, against abrasion and wear.

Release layer 20 can comprise a wax, wax-like or resinous material. Microcrystalline waxes, for example, high-density polyethylene waxes available as aqueous dispersions, can be used for this purpose. Other suitable materials include carnauba, beeswax, paraffin wax and wax-like materials such as poly(vinyl stearate), poly(ethylene sebacate), sucrose polyesters, poly(alkylene oxides) and dimethylglycol phthalate. Polymeric or resinous materials such as poly(methyl methacrylate) and copolymers of methyl methacrylate and monomers copolymerizable therewith can be employed. If desired, hydrophilic colloid materials, such as poly(vinyl alcohol), gelatin or hydroxyethyl cellulose can be included as polymer binding agents.

Resinous materials, typically coated as latices, can be used and latices of poly(methyl methacrylate) are especially useful. Cohesivity of layer 20 can be controlled so as to provide the desired and predetermined fracturing. Waxy or resinous layers which are disruptible and which can be fractured sharply at the interfaces of particles thereof can be used to advantage. If desired, particulate materials can be added to the layer to reduce cohesivity. Examples of such particulate materials include, silica, clay particles and particles of polytetrafluoroethylene.

Imaging medium 10 can be imaged by creating (in medium 10) a radiation pattern according to the information imaged. Exposure sources capable of providing radiation which can be imaged onto medium 10, and which can be converted by absorption into a predetermined pattern, can be used. Gas discharge lamps, xenon lamps and lasers are examples of such sources.

The exposure of medium 10 to radiation can be progressive or intermittent. For example, a two-sheet laminar medium, as shown in FIG. 1, can be fastened onto a rotating drum for exposure of the medium through sheet 12. A light spot of high intensity, such as is emitted by a laser, can be used to expose the medium 10 in the direction of rotation of the drum, while the laser is moved slowly in a transverse direction across the web, thereby to trace out a helical path. Laser drivers, designed to fire corresponding lasers, can be used to intermittently fire one or more lasers in a predetermined manner to thereby record information according to an original to be imaged. As is shown in FIG. 2, a pattern of intense radiation can be directed onto medium 10 by exposure to a laser from the direction of the arrows, the areas between the pairs of arrows defining regions of exposure.

It will be seen that the present imaging medium exhibits threshold-type behavior, in that, after exposure and peeling apart of the sheets 12 and 24, any particular area of the imaging layer is either wholly on the first sheet 12 or on the second sheet 24, depending upon the exposure which that area receives. The present imaging medium is thus very suitable for applications, for example reproduction of half-tone prints, in which such threshold-type behavior is desirable.

If desired, an imaging medium of the invention can be imaged using a moving slit or stencils or masks, and by using a tube or other source which emits radiation continuously and which can be directed progressively or intermittently onto medium 10.

Preferably, a laser or combination of lasers will be used to scan the medium and record information in the form of very fine dots or pels. Semiconductor diode lasers and YAG lasers having power outputs sufficient to stay within upper and lower exposure threshold values of medium 10 will be preferred. Useful lasers may have power outputs in the range of from about 40 milliwatts to about 1,000 milliwatts. An exposure threshold value, as used herein, refers to a minimal power required to effect an exposure, while a maximum power output refers to a power level tolerable by the medium before "burn out" occurs. Lasers are particularly preferred as exposing sources inasmuch as medium 10 may be regarded as a threshold-type of film; i.e., it possesses high contrast and, if exposed beyond a certain threshold value, will yield maximum density, whereas no density will be recorded below the threshold value. Especially preferred are lasers which are capable of providing a beam sufficiently fine to provide images having resolution as fine as 1,000 (e.g., 4,000 to 10,000) dots per centimeter.

The exposure time in the present process may vary widely depending upon the source and exposure technique employed. Since the depolymerization effected by the exposure is a permanent, effectively irreversible chemical change in the depolymerizable layer, the extent of depolymerization is proportional to the amount of radiation absorbed and does not depend upon the rate at which this radiation is absorbed; this is in contrast to some thermal imaging media, in which imaging depends upon the development within the medium of some temperature in excess of a threshold, in which case imaging is strongly dependent upon the rate at which the radiation is absorbed. Thus, in the present process both the intensity of the radiation and the exposure time can vary over a wide range. When the imaging medium is exposed through a mask so that all parts of the image are illuminated at once, exposure times may typically vary from about 1 to about 60 seconds. However, when a focussed laser is used to expose the imaging medium one pixel at a time, typically the radiation will be applied for an extremely short period, preferably of the order of $<0.5$ microsecond, and exposure time may be less than one millisecond.

Apparatus and methodology for forming images from media such as the medium of the present invention are described in detail in the commonly assigned patent application of Cargill et al., Ser. No. 07/616,658, filed Nov. 21, 1990.

From FIG. 2, it will be seen that the release layer 20 is either carried away on the second sheet 24 or remains on the exposed surface of the portions 18a of imaging material on the first sheet 12. Thus, since normally the image 10a is retained and used, while the complementary image 10b is discarded, the retained image 10a is not weakened by the presence of the release layer material, since such material is present, if at all, only on the surface of the non-exposed (black) areas of the image. Furthermore, it will be seen that the exposed areas are white in the image 10a, thus providing a "write white" process.

Figure 3:
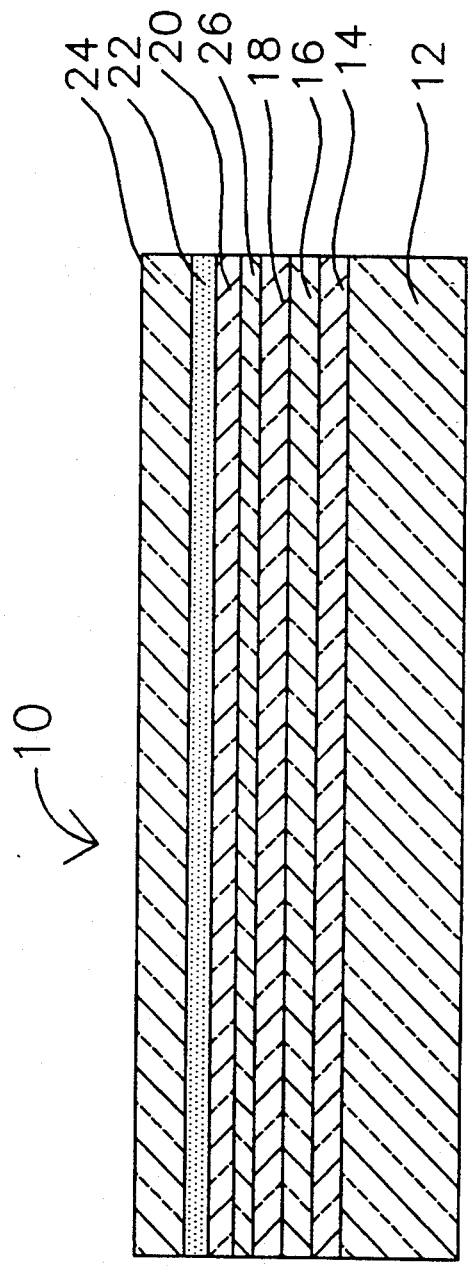
FIG. 3 shows in section a second imaging medium of the invention in which the layer of imaging material comprises a thermoplastic layer and a layer of porous or particulate material.
Figure 4:
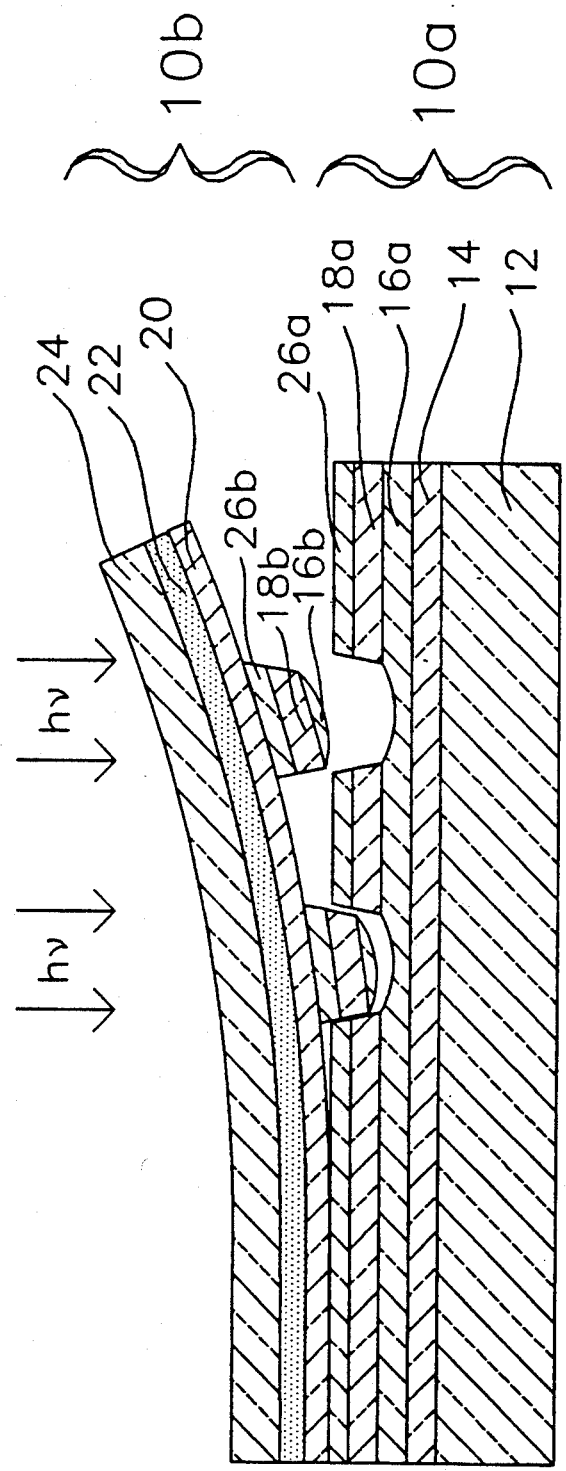
FIG. 4 shows a section through the second imaging medium as the first and second elements thereof are being separated to form a pair of complementary images.

FIGS. 3 and 4 show sections, similar to those of FIGS. 1 and 2 respectively, through a second direct imaging medium of the present invention in which the imaging layer comprises a layer 18 of porous or particulate imaging material in contact with the depolymerizable layer 16, and a thermoplastic layer 26 disposed between the layer 18 and the release layer 20, this thermoplastic layer 26 having a cohesive strength less than its adhesion to the layer 18, but greater than the adhesion of the layer 18 to the depolymerizable layer 16 after exposure. As a result of these cohesivity/adhesivity relationships, when the two sheets 12 and 24 are separated after imaging, the layers 18 and 26 fracture and move together, i.e., in the non-exposed areas, where the layer 18 remains attached to the depolymerizable layer 16, the exposed portions 26a and 18a of layers 26 and 18 both remain attached to the sheet 12, whereas in the exposed areas, the exposed portions 26b and 18b of layers 26 and 18 both remain with the sheet 24, as shown in FIG. 4.

To ensure that the layers 26 and 18 do fracture in this manner, it is essential that layers 26 and 18 be disruptible, such that a sharp fracture can occur between exposed and unexposed regions of the imaged medium, through the thickness of the layers and along a direction substantially orthogonal to the interface of the layers, i.e., substantially along the direction of the arrows in FIG. 4. This can be accomplished by forming the layer 26 as a discontinuous layer of discrete particles. For example, thermoplastic polymer particles can be applied from an aqueous latex containing the polymeric particles in dispersion. Coating and drying of the latex at temperatures below the softening temperature of the polymeric particles allow the formation of a layer in which separation occurs at the interfaces between particles. Examples of polymeric materials which can be used include poly(methyl methacrylate), poly(vinylidene chloride), poly(vinyl acetate), poly(vinyl chloride), polystyrene, poly(styrene-co-butadiene), cellulose acetate-butyrate, poly(styrene-co-acrylonitrile), polyacrylonitrile and the polyesters of aliphatic polyols, such as ethylene glycol and glycerol, and dicarboxylic acids (and the lower alkyl esters thereof), such as sebacic or adipic acid. If desired, dispersions of polymeric thermoplastic particles can be prepared by introducing an organic solvent, such as methylene chloride, containing dissolved polymer, such as poly(styrene-co-acrylonitrile), into an aqueous medium with agitation, and removing organic solvent to provide a coatable aqueous dispersion. A preferred material for layer 26 is a latex of poly(methyl methacrylate) which forms a uniform layer having desirable disruptibility for high-resolution imaging.

In the production of imaging medium 10, thermoplastic layer 26 can be applied onto depolymerizable layer 16 using known coating techniques for providing a thin layer of material.

The thickness of layer 26 can vary and, in general, will be of at least such thickness that, upon exposure and separation of images, the unexposed areas 26a will be sufficient to confer protection for the surface of image 10a, with greater thicknesses typically providing greater durability and protection. Good results can be obtained using a layer in the range of about 0.1 to 5 $\mu$m, and preferably from 0.3 to 1 $\mu$m.

If desired, various additives such as plasticizers, binders, colorants, softeners or the like can be added to layer 26. Film-forming binders such as hydroxyethyl cellulose, poly(vinyl alcohol), poly(styrene-co-maleic anhydride), poly(vinyl butyrate) or the like can be employed. Surfactants, to enhance dispersion of polymeric material or improve coatability, are also desirably included. Lubricity-enhancing agents, such as silicones and waxes, can be included to provide an image 10a having enhanced lubricity and improved durability. Waxes such as carnauba wax and waxy materials such as the poly(ethylene oxides) and low molecular weight polyethylene waxes can be employed for this purpose.

As already noted, in some cases it may be desirable to subject the images produced to a heating step to improve durability. Depending upon the particular nature of layer 26, the unexposed portions 26a thereof may, by coalescence or fusion, form a more durable and protective surface layer in image 10a.

As indicated, layer 26 is a disruptible layer which allows for sharp separation between exposed and unexposed regions. Disruptibility of layer 26 can be the result of including particulate matter in layer 26 to provide a discontinuous character and to assist in such separation. Thus, a layer 26 comprising a thermoplastic resin or wax or wax-like material can include solid particulate matter which serves to reduce the cohesivity of the thermoplastic layer and permit a sharper fracturing of the layer between exposed and unexposed areas. Examples of materials suited for this purpose are silica, clay materials such as kaolin, bentonite and attapulgite, alumina, calcium chloride, and pigments such as carbon black, milori blue, titania and baryta.

Figure 5:
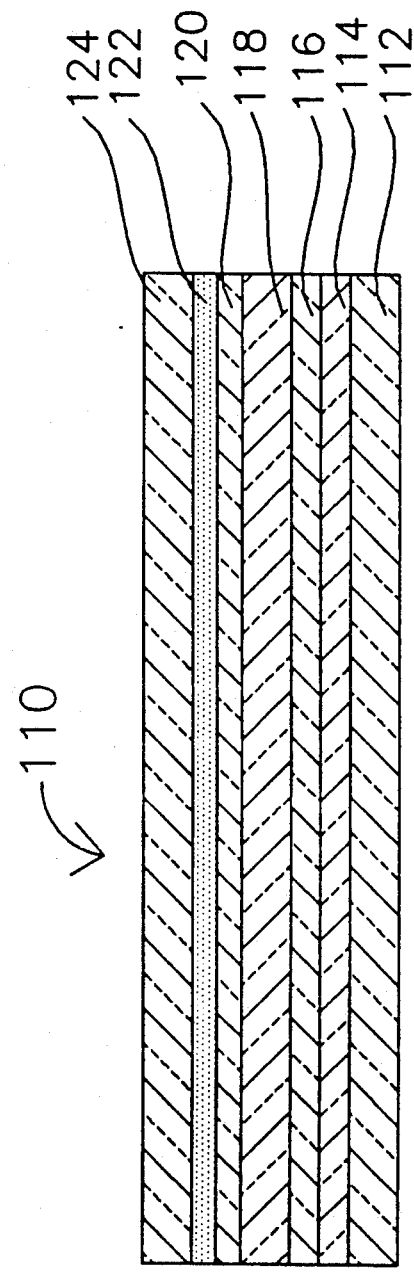

FIGS. 5 to 8 illustrate an indirect process of the present invention which uses an imaging medium generally designated 110. As shown in FIG. 5, medium 110 comprises a first sheet-like web material 112, stress-absorbing layer 114, a depolymerizable layer 116, an imaging layer 118, a release layer 120, an adhesive layer 122 and a second sheet-like web material 124. All of these sheets and layers are similar to the corresponding sheets and layers of the imaging medium 10 shown in FIGS. 1 and 2, except that the adhesion of the imaging layer 118 to the depolymerizable layer 116 is less than the adhesion of the imaging layer 18 to the depolymerizable layer 16 in the medium shown in FIGS. 1 and 2. In addition, since the first sheet 112 does not form part of the first image (see below), this sheet is made thinner than the sheet 12 in FIG. 1, and is conveniently of the same thickness as the sheet 24 in FIG. 1.

Figure 6:
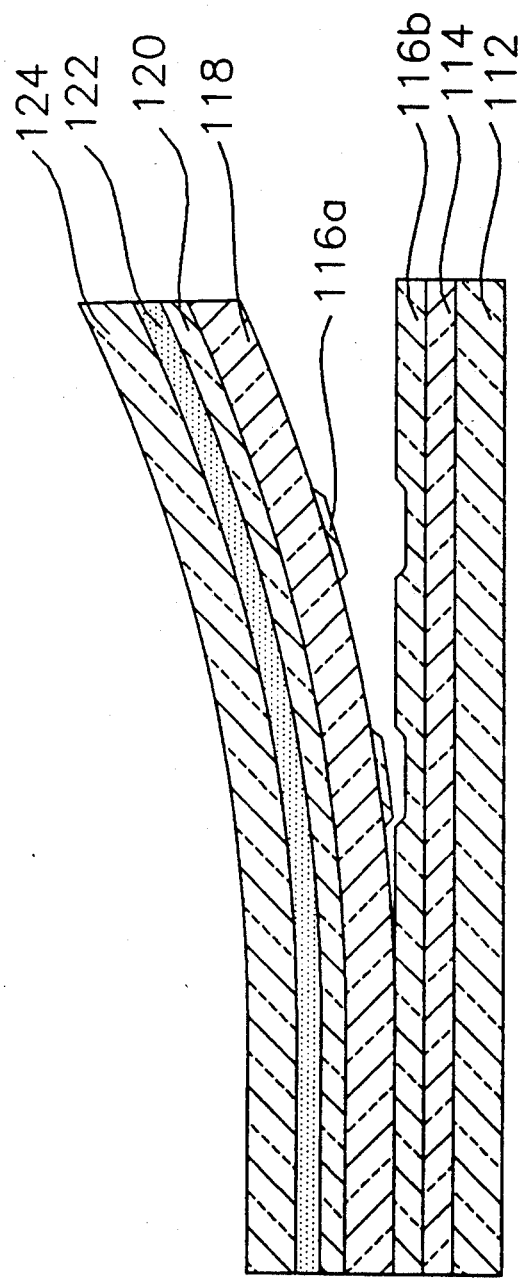

The medium 110 is imaged in the same way as the medium 10 and the sheets 112 and 124 of medium 110 are then separated. However, in this case, the adhesion of imaging layer 118 to depolymerizable layer 116 even in the non-exposed areas is lower than the cohesive strength of imaging layer 118, so that the whole of the imaging layer 118 stays attached to the second sheet 124. Furthermore, in the exposed areas, the depolymerizable layer 116 undergoes cohesive failure and portions 116a of depolymerizable layer 116 remain with the imaging layer 118 on the second sheet 124, as shown in FIG. 6, while the remainder 116b of the depolymerizable layer 116 remains on the first sheet 112.

Figure 7:
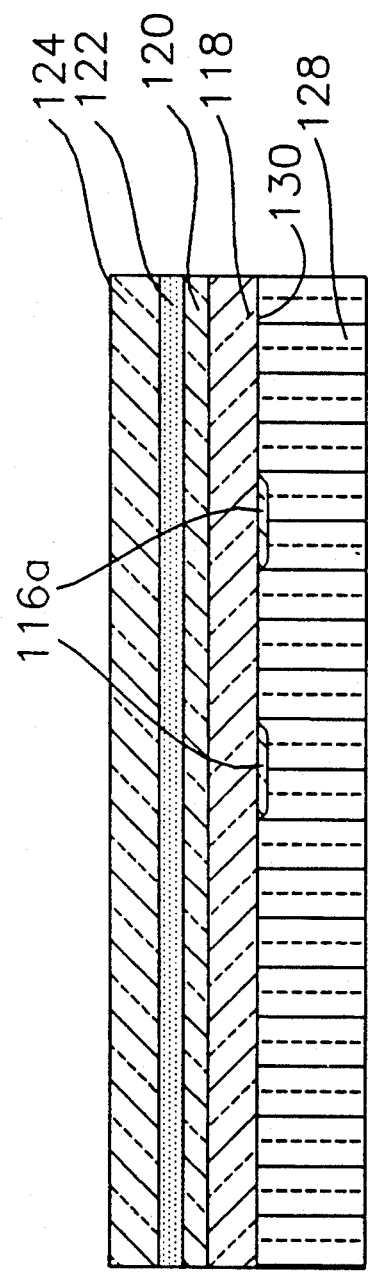

Next, as shown in FIG. 7, the imaging layer 118, with the portions 116a of the depolymerizable layer 116 attached thereto, is contacted with a transfer sheet 128 having an adhesive surface 130. In non-exposed areas, the imaging layer 118 adheres firmly to the adhesive surface 130, the adhesion of imaging layer 118 to surface 130 being greater than the cohesive strength of imaging layer 118. On the other hand, in exposed areas, the portions 116a of depolymerizable layer 116 adhere less firmly, if at all, to adhesive surface 130. Finally, as shown in FIG. 8, the second sheet 124 is peeled from the adhesive surface 130. Because of the firm adhesion of the non-exposed portions 118a of imaging layer 118 to the adhesive surface 130, these portions 118a remain on the transfer sheet 128, with cohesive failure occurring on the release layer 120. However, because of the low adhesion of the portions 116a of depolymerizable layer 116 to the adhesive surface 130, these portions, and exposed portions 118b of the imaging layer 118 in contact therewith, remain with the second sheet 124. As shown in FIG. 8, the remaining portions 116a of the depolymerizable layer 116 normally undergo cohesive failure, with parts thereof remaining attached to the surface 130 and other parts remaining attached to the exposed portions 118b. Thus, the imaging layer 118 fractures at the boundaries between the exposed and non-exposed areas thereof, with a complementary pair of images, 110a, 110b, being formed on the transfer sheet 128 and the second sheet 124 respectively, the image 110a on the transfer sheet 128 being the "write white" image.

Although for ease of illustration, the separation between the release layer 120 and the unexposed portions 118a is shown as occurring at the surface of the release layer in contact with those unexposed portions 118a, it will be appreciated that, as with the image 10a shown in FIG. 2, the image 110a may carry on the surface of its areas of imaging material part or all of the release layer 120, and this release layer material may serve to provide some surface protection for the image areas of image 110a, against abrasion and wear. If additional protection for the image areas is desired, the imaging medium 110 may be modified by including a thermoplastic intermediate layer between the imaging layer 118 and the release layer 120, this thermoplastic layer being similar in both composition and function to the thermoplastic intermediate layer 26 shown in FIGS. 3 and 4.

The following Examples are now given, though by way of illustration only, to show details of particularly preferred reagents, conditions and techniques used in the compositions and methods of the present invention.

EXAMPLE 1

This Example illustrates the preparation and direct imaging of an imaging medium of the invention in which the imaging layer comprises only a layer of particulate material in contact with the depolymerizable layer.

A depolymerizable layer coating solution was prepared by combining poly(hydrocinnamaldehyde) (35 mg) with triphenylsulfonium hexafluoroarsenate (19 mg) in 700 μL of dichloromethane. This coating solution was coated onto a sheet of 1.5 mil (38 μm) raw poly(ethylene terephthalate) (PET) and the coated sheet air dried to give a depolymerizable layer approximately 3 μm in thickness.

An imaging layer coating suspension was prepared containing five parts by weight carbon black, one part by weight polytetrafluoroethylene latex (Hostaflon, sold by Hoechst AG) and one part by weight poly(vinyl alcohol) (Gelvatol 20-90, sold by Monsanto Chemical Corp.) suspended in water. This suspension was coated on top of the depolymerizable layer and dried to give an imaging layer approximately 0.5-2.0 μm thick and having a transmission optical density of approximately 3.

A release layer was formed on top of the imaging layer by coating an aqueous suspension containing ten parts by weight Carnauba wax, ten parts by weight colloidal silica (Nyacol 1430LS), one part by weight poly(vinyl alcohol) (Gelvatol 20-90), and 0.1 part by weight surfactant, and drying to produce a release layer approximately 2 μm thick. Finally, the release layer surface of the resultant coated sheet was laminated to a transparent tape.

The medium thus produced was exposed through the 1.5 mil PET sheet, using a mask, to ultraviolet radiation. The transparent tape was then peeled from the PET sheet to produce a high contrast image, with exposed regions of the imaging material remaining on the tape.

EXAMPLE 2

This Example illustrates the preparation and direct imaging of an imaging medium of the invention in which the imaging layer comprises only a layer of particulate material in contact with the depolymerizable layer.

A depolymerizable layer coating solution was prepared by combining 42 mg of a polycarbonate having a repeating unit of the formula:

$+CH_2\text{-}p\text{-}C_6H_4-CH_2-O-CO-O-C(CH_3)_2-CH_2CH_2-C(CH_3)_2-O-CO-O+$ (where p-$C_6H_4$ represents a para-phenylene group) with triphenylsulfonium hexafluoroarsenate (8 mg) in 750 μL of dichloromethane. This coating solution was coated onto a sheet of T-subbed 4 mil (101 μm) PET and the coated sheet air dried to give a depolymerizable layer approximately 3 μm in thickness. An aqueous suspension of carbon black was coated on top of the depolymerizable layer and dried to give an imaging layer approximately 5 μm thick.

A release layer was formed on top of the imaging layer by coating an aqueous suspension containing ten parts by weight polytetrafluoroethylene latex (Hostaflon), ten parts by weight colloidal silica (Nyacol 1430LS) and one part by Weight poly(vinyl alcohol) (Gelvatol 20-90), and drying to produce a release layer approximately 1 μm thick.

Finally, the release layer surface of the resultant coated sheet was laminated under pressure to a sheet of 4 mil PET coated with approximately 20 μm of Flexbond 150 adhesive.

The medium thus produced was exposed through the T-subbed PET sheet, using a mask, to 365 nm ultraviolet radiation. After exposure, the medium was heated on a hot plate at 90° C. for 20 seconds. The two sheets were then separated and produced a clear pair of images.

EXAMPLE 3

This Example illustrates the preparation and indirect imaging of an imaging medium of the invention in which the imaging layer comprises only a layer of particulate material in contact with the depolymerizable layer.

A depolymerizable layer coating solution was prepared by combining poly(o-phthalaldehyde) (40 mg) with triphenylsulfonium hexafluoroarsenate (7 mg) in 800 μL of cyclohexanone. This coating solution was coated onto a sheet of 4 mil (101 μm) PET and the coated sheet oven dried at 90° C. for 20 minutes to give a depolymerizable layer approximately 2 μm in thickness.

An imaging layer coating suspension was prepared containing three parts by weight carbon black and one part by weight poly(vinyl alcohol) (Gelvatol 20-90) suspended in water. This suspension was coated on top of the depolymerizable layer and dried to give an imaging layer having a transmission optical density of approximately 3.

A release layer was formed on top of the imaging layer by coating an aqueous suspension containing ten parts by weight Carnauba wax, ten parts by weight colloidal silica (Nyacol 1430LS), one part by weight poly(vinyl alcohol) (Gelvatol 20-90), and 0.1 part by weight surfactant, and drying to produce a release layer approximately 2 μm thick. Finally, the release layer surface of the resultant coated sheet was laminated to a transparent tape.

The medium thus produced was exposed through the 4 mil PET sheet, using a mask, to 330 nm monochromatic ultraviolet radiation from a 150 W Oriel xenon arc lamp which had been passed through a monochromator to give an incident flux on the imaging medium of approximately 90 μW/cm². The medium was exposed for 4 minutes so that the total incident radiation on the medium was approximately 12 mJ/cm². The transparent tape was then peeled from the PET sheet, with all of the imaging material remaining attached to the tape, so that no image was formed. However, when the removed tape was placed in contact with a second adhesive tape and the two tapes were then peeled apart, a pair of high contrast images were formed on the tapes.

We claim:
1. An imaging process comprising:
 providing a polymeric, depolymerizable layer comprising a depolymerizable polymer which at least partially depolymerizes in the presence of acid, the depolymerizable layer further comprising an infrared dye capable of absorbing infra-red radiation in the range of about 800 to about 1,200 nm and an acid generator capable of generating acid, the depolymerizable layer undergoing a reduction in cohesivity upon at least partial depolymerization of the polymer;

providing a layer of an imaging material on the depolymerizable layer, the layer of the imaging material having a cohesive strength greater than the cohesive strength of the depolymerizable layer after at least partial depolymerization of the polymer but less than the cohesive strength of the depolymerizable layer prior to depolymerization of the polymer, thereby providing an imaging medium;

imagewise exposing portions of the imaging medium to infra-red actinic radiation in the range of about 800 to about 1,200 nm, thereby causing absorption of the infra-red radiation by the infra-red dye, generation of acid by the acid generator, and at least partial depolymerization of the polymer in the exposed areas of the depolymerizable layer and rendering these exposed areas lower in cohesivity than the unexposed areas; and applying to the layer of imaging material a separating force sufficient to remove the imaging material from the exposed areas of the depolymerizable layer, but insufficient to remove the imaging material from the unexposed areas of the depolymerizable layer, and thus forming an image.

2. A process according to claim 1 wherein the polymer comprises a polyaldehyde or a polycarbonate.

3. A process according to claim 1 wherein the polymer comprises poly(o-phthalaldehyde) or polybutyraldehyde.

4. A process according to claim 1 wherein the layer of imaging material comprises a porous or particulate imaging material in contact with the depolymerizable layer.

5. A process according to claim 1 wherein, during exposure or after exposure of the imaging medium to the radiation but before removal from the depolymerizable layer of the portions of the imaging material in the exposed areas, the imaging medium is heated.

6. A process according to claim 1 wherein the imaging medium further comprises a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after exposure to the radiation, but less than the cohesive strength of the depolymerizable layer prior to exposure to the radiation, and wherein the separating force is applied by separating the first and second support sheets, thereby producing a pair of images on the two support sheets.

7. An imaging process comprising:

providing a polymeric depolymerizable layer which, upon exposure to actinic radiation, becomes at least partially depolymerized, the depolymerizable layer undergoing a reduction in cohesivity upon at least partial depolymerization of the polymer;

providing a layer of a porous or particulate imaging material on the depolymerizable layer, the layer of the imaging material having a cohesive strength greater than the cohesive strength of the depolymerizable layer after at least partial depolymerization of the polymer but less than the cohesive strength of the depolymerizable layer prior to depolymerization of the polymer, thereby providing an imaging medium;

providing a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after exposure to the radiation, but less than the cohesive strength of the depolymerizable layer prior to exposure to the radiation, thereby providing an imaging medium;

imagewise exposing portions of the imaging medium to actinic radiation, thereby causing at least partial depolymerization of the polymer in the exposed areas of the depolymerizable layer and rendering these exposed areas lower in cohesivity than the unexposed areas;

separating the first and second support sheets, and thereby removing from the depolymerizable layer the portions of the imaging material in the unexposed areas, but leaving the portions of the imaging material in the exposed areas adhered to the depolymerizable layer, and thus producing a pair of images on the two support sheets;

thereafter providing a laminating sheet comprising a durable layer and a support layer;

placing the laminating sheet in contact with one of said images such that the durable layer faces the image and at least one portion of the laminating sheet extends beyond the periphery of the support layer carrying the image;

laminating the laminating sheet to the image so that the durable layer adheres to both the areas of the imaging material forming the image and the exposed areas of support sheet; and separating the support layer from the image such that the durable layer remains attached to the image, but, in said at least one portion of the laminating sheet, the durable layer remains attached to the support layer so that the durable layer breaks substantially along the periphery of the associated element, thereby covering the image with a durable layer, this layer:

a. being substantially transparent;

b. having an abrasion resistance of at least 10 cycles of a 10 Newton force as measured by an Erikson Abrasion Meter and a critical load value of at least 100 grams as measured by ANSI PH1.37-1983; and c. not being removed from the image by contract with adhesive tape having an adhesion to steel of 33 grams per millimeter, as measured by ASTM D-3330.

8. An imaging process comprising:

providing a polymeric, depolymerizable layer which, upon exposure to actinic radiation, becomes at least partially depolymerized, the depolymerizable layer undergoing a reduction in cohesivity upon at least partial depolymerization of the polymer;

providing a layer of a porous or particulate imaging material in contact with the depolymerizable layer, the layer of the imaging material having a cohesive strength greater than the cohesive strength of the depolymerizable layer after at least partial depolymerization of the polymer but less than the cohesive strength of the depolymerizable layer prior to depolymerization of the polymer, thereby providing an imaging medium;

providing a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after exposure to the radiation, but less than the cohesive strength of the depolymerizable layer prior to exposure to the radiation;

providing a thermoplastic intermediate layer disposed between the layer of porous or particulate imaging material and the second support sheet, thereby providing an imaging medium;

imagewise exposing portions of the imaging medium to actinic radiation, thereby causing at least partial depolymerization of the polymer in the exposed areas of the depolymerizable layer, rendering these exposed areas tacky and firmly attaching exposed portions of the imaging material layer to the depolymerizable layer, the adhesion of the thermoplastic intermediate layer to second support sheet being greater than the adhesion of the porous or particulate imaging material to the first support sheet in the exposed areas but less than the adhesion of the porous or particulate imaging material to the first sheet in the exposed areas;

separating the first and second support sheets, so that, in the exposed areas both the layer of porous or particulate imaging material and the thermoplastic intermediate layer remain with the second support sheet, while in the unexposed areas both the layer of porous or particulate imaging material and the thermoplastic intermediate layer remain with the first support sheet, and thus producing a pair of images on the two support sheets.

9. An imaging medium comprising:
a polymeric depolymerizable layer comprising a depolymerizable polymer which, upon exposure to actinic radiation, becomes at least partially depolymerized, the depolymerizable layer undergoing a reduction in cohesivity upon at least partial depolymerization of the polymer;

a layer of a porous or particulate imaging material on the depolymerizable layer, the layer of the imaging material having a cohesive strength greater than the cohesive strength of the depolymerizable layer after at least partial depolymerization of the polymer, but less than the cohesive strength of the depolymerizable layer prior to depolymerization of the polymer a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after at least partial depolymerization of the polymer, but less than the cohesive strength of the depolymerizable layer prior to depolymerization of the polymer; and a release layer disposed between the second support sheet and the imaging material layer, such that upon separation of the first and second support sheets following exposure of areas of the imaging medium to the radiation, in the unexposed areas failure occurs within or on one surface of the release layer.

10. An imaging medium according to claim 9 wherein the depolymerizable layer comprises an acid generator which generates acid when exposed to the radiation, and the polymer at least partially depolymerizes in the presence of acid.

11. An imaging medium according to claim 10 wherein the acid generator comprises an onium salt.

12. An imaging medium according to claim 9 wherein the depolymerizable layer comprises a radiation absorber which generates heat when exposed to the radiation, and a thermochemical acid generator which generates acid when heated, and the polymer at least partially depolymerizes in the presence of acid.

13. An imaging medium according to claim 9 wherein the depolymerizable layer comprises a polymer containing photosensitive groups.

14. An imaging medium according to claim 9 wherein the polymer comprises a polyaldehyde or a polycarbonate.

15. An imaging medium according to claim 14 wherein the polymer comprises poly(o-phthalaldehyde) or polybutyraldehyde.

16. An imaging medium comprising:
a polymeric depolymerizable layer comprising a depolymerizable polymer which, upon exposure to actinic radiation, becomes at least partially depolymerized, the depolymerizable layer undergoing a reduction in cohesivity upon at least partial depolymerization of the polymer;

a layer of a porous or particulate imaging material in contact with the depolymerizable layer, the layer of the imaging material having a cohesive strength greater than the cohesive strength of the depolymerizable layer after at least partial depolymerization of the polymer, but less than the cohesive strength of the depolymerizable layer prior to depolymerization of the polymer a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after at least partial depolymerization of the polymer, but less than the cohesive strength of the depolymerizable layer prior to depolymerization of the polymer; and a thermoplastic intermediate layer disposed between the layer of porous or particulate imaging material and the second support sheet, the adhesion of the thermoplastic intermediate layer to the second support sheet being greater than the adhesion of the porous or particulate imaging material to the first support sheet in the exposed areas but less than the adhesion of the porous or particulate imaging material to the first sheet in the exposed areas.

17. An imaging process comprising:
providing a polymeric, depolymerizable layer which, upon exposure to actinic radiation, becomes at least partially depolymerized, the depolymerizable layer undergoing a reduction in cohesivity upon at least partial depolymerization of the polymer;

providing a layer of an imaging material on the depolymerizable layer, the layer of the imaging material having a cohesive strength greater than the cohesive strength of the depolymerizable layer after at least partial depolymerization of the polymer but less than the cohesive strength of the depolymerizable layer prior to depolymerization of the polymer, thereby providing an imaging medium;

imagewise subjecting portions of the imaging medium to expose to radiation, thereby causing at least partial depolymerization of the polymer in the exposed areas of the depolymerizable layer and rendering these exposed areas lower in cohesivity than the unexposed areas;

separating the layer of imaging material from the unexposed areas of the depolymerizable layer such that the exposed areas of the depolymerizable layer undergo cohesive failure, with part of the depolymerizable layer in these exposed areas remaining with the layer of imaging material;

contacting the layer of imaging material and the portions of the depolymerizable layer attached thereto with an adhesive surface such that the imaging material adheres more strongly to the adhesive surface than do the portions of the depolymerizable layer; and applying to the layer of imaging material a separating force sufficient to remove from the adhesive surface the exposed areas of the imaging material and at least part of the portions of the depolymerizable layer associated therewith, but insufficient to remove from the adhesive surface the unexposed areas of the imaging material, and thus forming an image.

18. A process according to claim 17 wherein the imaging medium further comprises a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after exposure to the radiation, but less than the cohesive strength of the depolymerizable layer prior to exposure to the radiation, and wherein the separating force is applied by separating the first and second support sheets, thereby producing a pair of images on the two support sheets.

19. An imaging process comprising:
providing a polymeric, depolymerizable layer comprising a depolymerizable polymer which at least partially depolymerizes in the presence of acid, a radiation absorber capable of generating heat when exposed to radiation, and a thermochemical acid generator which generates acid when heated, the depolymerizable layer undergoing a reduction in cohesivity upon at least partial depolymerization of the polymer, providing a layer of an imaging material on the depolymerizable layer, the layer of the imaging material having a cohesive strength greater than the cohesive strength of the depolymerizable layer after at least partial depolymerization of the polymer but less than the cohesive strength of the depolymerizable layer prior to depolymerization of the polymer, thereby providing an imaging medium;

imagewise exposing portions of the imaging medium to actinic radiation, thereby causing absorption of the radiation by the radiation absorber, generation of acid by the thermochemical acid generator, and at least partial depolymerization of the polymer in the exposed areas of the depolymerizable layer and rendering these exposed areas lower in cohesivity than the unexposed areas; and applying to the layer of imaging material a separating force sufficient to remove the imaging material from the exposed areas of the depolymerizable layer, but insufficient to remove the imaging material from the unexposed areas of the depolymerizable layer, and thus forming an image.

20. A process according to claim 19 wherein the radiation is visible or infra-red radiation having a wavelength in the range of about 400 to about 1,200 nm.

21. A process according to claim 19 wherein the imaging medium further comprises a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after exposure to the radiation, but less than the cohesive strength of the depolymerizable layer prior to exposure to the radiation, and wherein the separating force is applied by separating the first and second support sheets, thereby producing a pair of images on the two support sheets.

22. An imaging medium comprising:
a polymeric, depolymerizable layer comprising a depolymerizable polymer which at least partially depolymerizes in the presence of acid, the depolymerizable layer further comprising an infra-red dye capable of absorbing infra-red radiation in the range of about 800 to about 1,200 nm and an acid generator capable of generating acid, the depolymerizable layer undergoing a reduction in cohesivity upon at least partial depolymerization of the polymer; and a layer of a porous or particulate imaging material on the depolymerizable layer, the layer of the imaging material having a cohesive strength greater than the cohesive strength of the depolymerizable layer after at least partial depolymerization of the polymer, but less than the cohesive strength of the depolymerizable layer prior to depolymerization of the polymer.

23. An imaging medium according to claim 22 further comprising a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after exposure to the radiation, but less than the cohesive strength of the depolymerizable layer prior to exposure to the radiation, and wherein the separating force is applied by separating the first and second support sheets, thereby producing a pair of images on the two support sheets.

24. An imaging medium comprising:
a polymeric, depolymerizable layer comprising a depolymerizable polymer which at least partially depolymerizes in the presence of acid, a radiation absorber capable of generating heat when exposed to radiation, and a thermochemical acid generator capable of generating acid when heated, the depolymerizable layer undergoing a reduction in cohesivity upon at least partial depolymerization of the polymer; and a layer of a porous or particulate imaging material on the depolymerizable layer, the layer of the imaging material having a cohesive strength greater than the cohesive strength of the depolymerizable layer after at least partial depolymerization of the polymer, but less than the cohesive strength of the depolymerizable layer prior to depolymerization of the polymer.

25. An imaging medium according to claim 24 further comprising a first support sheet secured to the depolymerizable layer and a second support sheet adhered to the face of the imaging material layer remote from the depolymerizable layer, the adhesion of the second support sheet to the imaging material layer being greater than the cohesive strength of the depolymerizable layer after exposure to the radiation, but less than the cohesive strength of the depolymerizable layer prior to exposure to the radiation, and wherein the separating force is applied by separating the first and second support sheets, thereby producing a pair of images on the two support sheets.

* * * * *